United States Patent [19]
Ogino et al.

[11] Patent Number: 5,228,568
[45] Date of Patent: Jul. 20, 1993

[54] SEMICONDUCTOR WAFER BASKET

[75] Inventors: Nobuyoshi Ogino, Musashino; Toshitsugu Yajima, Itoigawa, both of Japan

[73] Assignee: Shin-Etsu Handotai Co., Ltd., Tokyo, Japan

[21] Appl. No.: 937,218

[22] Filed: Aug. 28, 1992

[30] Foreign Application Priority Data

Aug. 30, 1991 [JP] Japan .................................. 3-245252
Aug. 30, 1991 [JP] Japan .................................. 3-245253

[51] Int. Cl.$^5$ ............................................. B65D 85/30
[52] U.S. Cl. .................................. 206/334; 206/587; 206/591
[58] Field of Search ...................... 206/334, 591, 587

[56] References Cited

U.S. PATENT DOCUMENTS

| | | | |
|---|---|---|---|
| 4,043,451 | 8/1977 | Johnson | 206/334 |
| 4,061,228 | 12/1977 | Johnson | 206/591 X |
| 4,450,960 | 5/1984 | Johnson | 206/334 |
| 4,718,549 | 1/1988 | Rissotti et al. | 206/334 |
| 4,721,207 | 1/1988 | Kikuchi | 206/334 |
| 4,793,488 | 12/1988 | Mortensen | 206/334 |
| 4,817,795 | 4/1989 | Kos | 206/587 X |
| 4,817,799 | 4/1989 | Gregerson et al. | 206/334 X |
| 5,025,926 | 6/1991 | Gregerson et al. | 206/334 X |
| 5,046,615 | 9/1991 | Nentl et al. | 206/334 X |

Primary Examiner—William I. Price
Attorney, Agent, or Firm—Whitham & Marhoefer

[57] ABSTRACT

A wafer basket having a detachable wafer press means on the back face of the top lid, which resilient press strips are bent and capable of temporarily changing the bent angles in response to external shocks such that the free end of each press strip at which each strip presses on the wafer stays immobile with respect to the edge of the wafer.

8 Claims, 15 Drawing Sheets

SEMICONDUCTOR WAFER BASKET

BACKGROUND OF THE INVENTION

1. Field of the Invention

The present invention relates to a semiconductor wafer basket for containing wafers having a detachable wafer press means provided underneath the top lid of the wafer basket.

2. Description of the Prior Art

Semiconductor wafers to be made into substrates for semiconductor electronic devices are obtained by thinly slicing a single crystal ingot of a semiconductor material such as silicon in a direction substantially perpendicular to the axis of the ingot. Thus, a semiconductor wafer is thin and fragile; besides, it need be kept clean from any contamination. Hence, transportation of wafers requires a great care and caution.

For this reason, it was a conventionally adopted practice to place wafers in a row at regular intervals in a wafer basket and transport the wafers in the basket. A wafer basket is a box-like rack for containing semiconductor wafers, and is commonly molded integrally of a synthetic resin. In construction the wafer basket comprises numerous shelves for receiving wafers in a row, each shelf consisting of a groove defined by a pair of neighboring partition ribs which ribs are formed at regular intervals. The wafer basket is also a vehicle means for transporting the wafers it contains. FIG. 19 shows a front view of an example of such conventional wafer basket, partially broken for a better view of its inside. This wafer basket consists of an outer box 101 and an inner box 102, and a plurality of wafers W are each received in the respective grooves defined by and between partition ribs which form the pleated side walls 102a, 102b of the inner box 102, which are facing each other; therefore, the wafers are placed in a row perpendicular to the sheet of FIG. 19 at regular intervals in the inner box 102. Also, a wafer press means 103, consisting of a plurality of resilient press strips each having an engagement groove, is detachably attached to the inside face of the top lid 101B of the outer box 101, and when the lid is placed to close the wafer container, as shown in FIG. 19, the upper edges of the wafers W stored in the inner box 102 are caught in the engagement grooves and thereby depress the respective resilient press strips of the wafer press means 103, which in turn resiliently biases the wafers downward so that when the wafer container receives a shock during a transportation, the wafer press means 103 absorbs the shock and prevents the wafers from shaking and thus incurring a damage.

However, such conventional wafer press means as shown in FIG. 19 is liable to rub itself against the wafers' edges as the wafer container receives a shock, and thus the wafer press means is ground and produces particles which contaminate the wafers W.

Also, the wafer W itself incurs damages as it is rubbed repeatedly by the wafer press means 103.

Furthermore, there is a problem with the conventional wafer baskets that when the wafers W are stored in the wafer basket and the top lid 101B is fitted on the outer box 101, some of the wafers W may fail to be caught in the engagement grooves of the respective resilient press strips of the wafer press means 103 but slip into gaps between the press strips; such dislocated wafers are loosely seated in the basket and are liable to damage themselves from transportation shocks and they rub themselves against the press strips to create contaminator particles.

The present invention was made in view of the above problems, and it is, therefore, an object of the invention to provide a wafer basket wherein the wafer press means is so constructed that there occurs scarce rubbing between the wafer and the press means which may create particles, and that the wafers in the wafer basket do not miss the grooves of the respective press strips of the wafer press means as the top lid is fitted on the outer box, so that all the wafers are resiliently pressed by the shock-absorbing press means.

MEANS TO SOLVE THE PROBLEMS

The objects of the present invention are fulfilled by providing a wafer basket comprising a main body and a top lid provided with a detachable wafer press means on the back face of the top lid, characterized by that the wafer press means includes a rectangular frame, and two rows of resilient press strips which are made of a thermoplastic elastomer having a high friction coefficient and extend downwardly from the rectangular frame for pressing down wafers to be contained in the wafer basket, the resilient press strips being bent and capable of temporarily changing the bent angles in response to external shocks such that the free end of each press strip at which each strip presses on the wafer stays immobile with respect to the edge of the wafer.

In an embodiment, the resilient press strips are bent at least two locations for better resilience.

In a preferred embodiment, the resilient press strips are made of a polyester resin.

In a still more preferred embodiment, the resilient press strips are each provided with guide ramps on either side of the free end portion in a manner such that the guide ramps of the same press strips form grooves into which the wafer edges are guided by the guide ramps and such that, when seen in the direction of the length of the free end portion of the press strips, the guide ramps overlap with the guide ramps of the neighboring press strips without touching the guide ramps of the neighboring press strips so that the guide ramps prevent the wafer edges from entering the gaps between the press strips.

In a further embodiment, the guide ramps are seen like saw teeth or comb teeth closed arranged and meshed with neighboring teeth when seen from below.

In a still further embodiment, the wafer press means further comprises an orientation flat press means which is elongated in the direction the wafers are arranged, and is adapted to engage with the orientation flat of each wafer.

EFFECTS OF THE INVENTION

According to the invention, even when wafers stored in a wafer basket are caused to vibrate during transportation, the resilient press strips keep pressing the wafers, scarcely vibrating at the pressing ends, and do not move relative to the wafer edges, owing to the resilience of the press strips facilitated by the bents of the press strips, so that the press strips do not rub themselves on the wafer edges to produce particles which would contaminate the wafers. The wafer press means are also effective to hold the wafers in the grooves to protect them from external damaging shocks.

Also, according to a preferred mode of the invention, the guide ramps of the same press strips form grooves into which the wafer edges are guided by the guide ramps and the guide ramps are disposed such that, when seen in the direction of the length of the free end portion of the press strips, the guide ramps overlap with the guide ramps of the neighboring press strips without touching the guide ramps of the neighboring press strips, so that the guide ramps prevent the wafer edges from entering the gaps between the press strips but guide the wafer edges into the grooves without fail. Therefore, the wafers are not damaged by being inadvertently caught between the press strips.

Further scope of applicability of the present invention will become apparent from the detailed description given hereinafter. However, it should be understood that the detailed description and specific examples, while indicating preferred embodiments of the invention are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

EMBODIMENTS

Next, a first embodiment of the invention will be described with reference to FIGS. 1 through 11.

Figure 11:
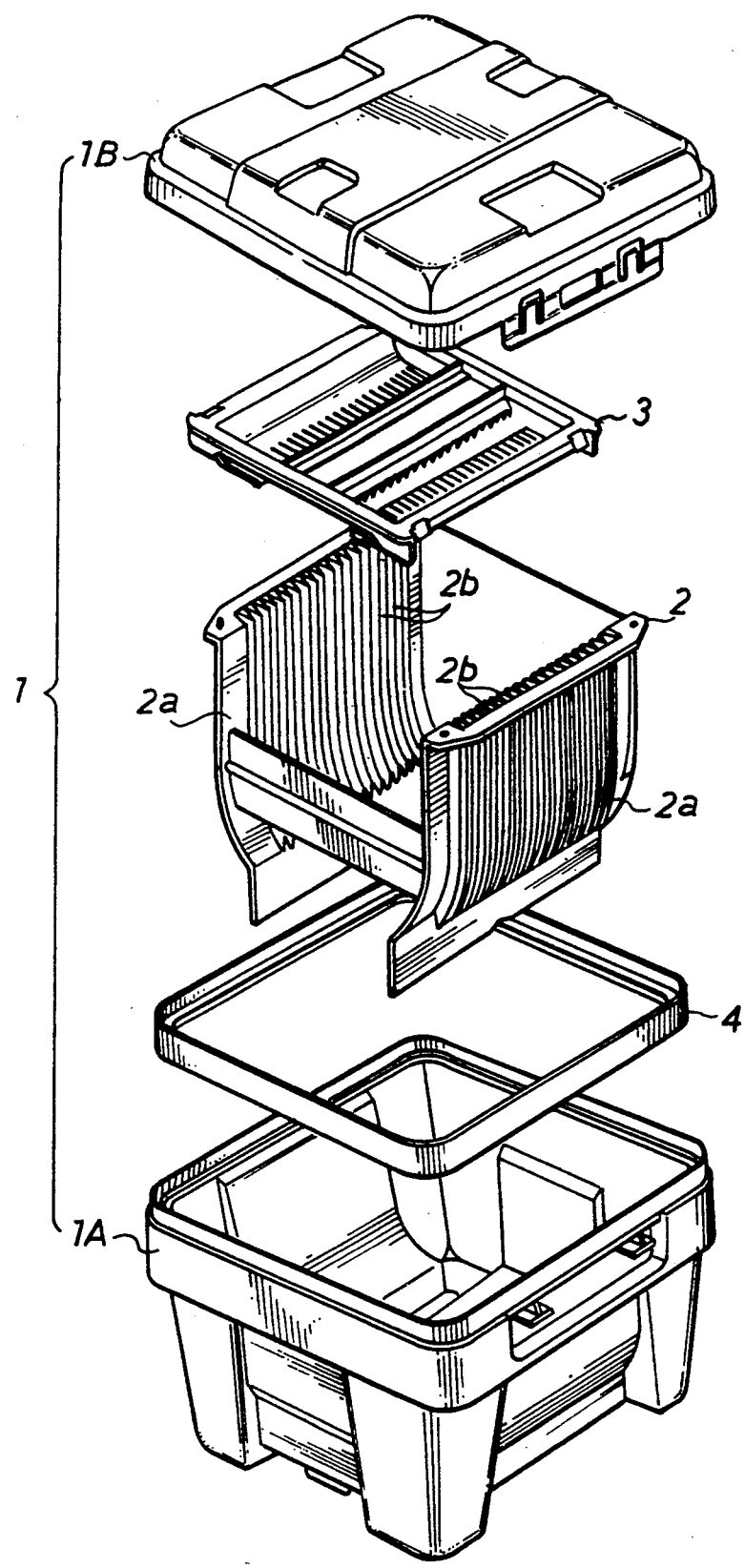
FIG. 11 is an exploded perspective view of the basket.

At first, the construction of a wafer basket will be briefly described with reference to FIG. 11, which is an exploded perspective view of the basket. The wafer basket is mainly composed of an outer box 1, an inner box 2 inserted in the outer box 1, and a wafer press means 3 in which the improvement of the invention lies.

The outer box 1 consists of a main body 1A and a top lid 1B. An annular seal ring 4 is fitted on the upper rim of the main body 1A and the top lid 1B fits on the main body 1A over this seal ring 4. When the main body 1A is thus covered with the top lid 1B, the outer box 1 is hermetically closed by virtue of the seal ring 4.

The inner box 2 is for holding a plurality of wafers in a row at regular intervals; it opens upward as well as in the bottom, the bottom opening being narrower than the upper opening, because a pair of facing side walls 2a, 2a are curved inwardly at the bottom in a manner such that a wafer-sized circle may be roughly inscribed to the inner surface of the curved side walls. The side walls 2a, 2a are pleated to form ribs 2b which extend vertically and are arranged in a horizontal row at regular short intervals, the intervals forming grooves for receiving wafers. The opposing side walls 2a, 2a are in mirror symmetry so that each pair of facing grooves form a seat suitable to receive a wafer vertically. Thus, the wafers are fitted into respective pairs of facing grooves of the side walls 2a, 2a.

Figure 1:
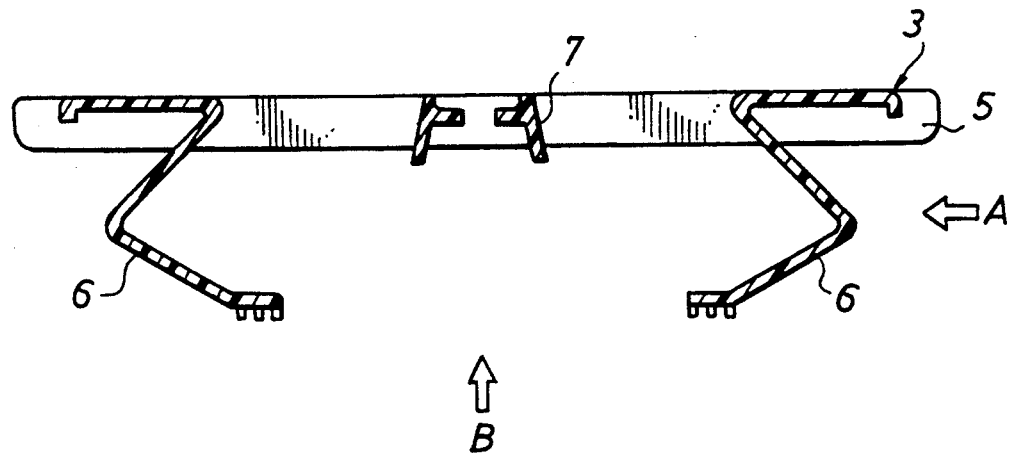
FIG. 1 is a vertical cross section of a wafer press means.
Figure 2:
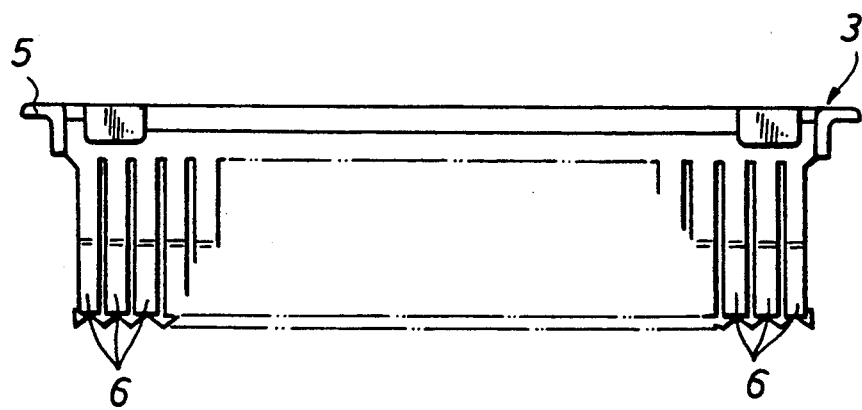
FIG. 2 is a side view of the same wafer press means as seen in the direction of the arrow A of FIG. 1.
Figure 3:
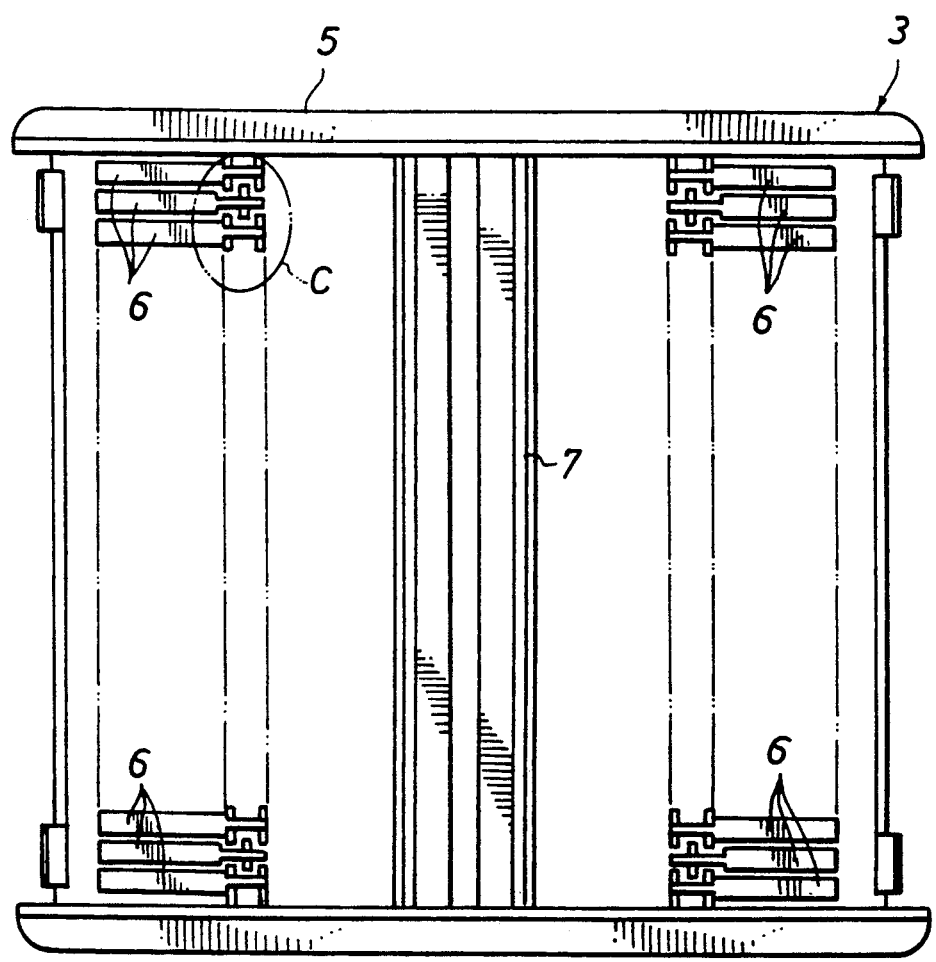
FIG. 3 is a bottom view of the same wafer press means as seen in the direction of the arrow B of FIG. 1.

Next, the construction of a wafer press means 3, according to the invention, will be described in detail with reference to FIGS. 1 through 6. Incidentally, FIG. 1 is a vertical cross section of the wafer press means 3, FIG. 2 is a side view of the same means 3 as seen in the direction of the arrow A of FIG. 1, FIG. 3 is a bottom view of the same means 3 as seen in the direction of the arrow B of FIG. 1, FIG. 4 is an enlarged view of the portion C of FIG. 3, FIG. 5 is a view of the portion C as seen in the direction of the arrow D of FIG. 4, FIG. 6 is a cross section taken on the line E—E of FIG. 4, and FIG. 7 is a cross section taken on the line F—F of FIG. 4.

The wafer press means 3 of this embodiment is made of a thermoplastic elastomer, preferably a polyester, having a high friction coefficient, produced by monobloc casting. The wafer press means 3 includes a rectangular frame 5, from which extend downwardly two rows of resilient press strips 6, which 6 are bent generally in the following manner (ref. FIG. 1): the uppermost portion is horizontal and on a same level with the frame 5, a second portion begins from the inner end of said uppermost portion and extends downward in a direction that forms an angle of about 50° with said uppermost portion, a third portion begins from the lower end of said second portion and extends downward in a direction that forms an angle of about 80° with said second portion, and the lowermost short portion extends horizontally and inwardly from the lower end of said third portion. Thus, when seen as they are in FIG. 1, they look like a pair of inequality signs opening inwardly and toward each other. The two rows of the resilient press strips 6 are arranged in a row parallel to each other (perpendicular to the sheet of FIG. 1) and at the same close intervals as the ribs 2b. In parallel with, and in the midway between, the two rows of the resilient press strips 6 of the frame 5 are provided two pieces of orientation flat press means 7.

Figure 4:
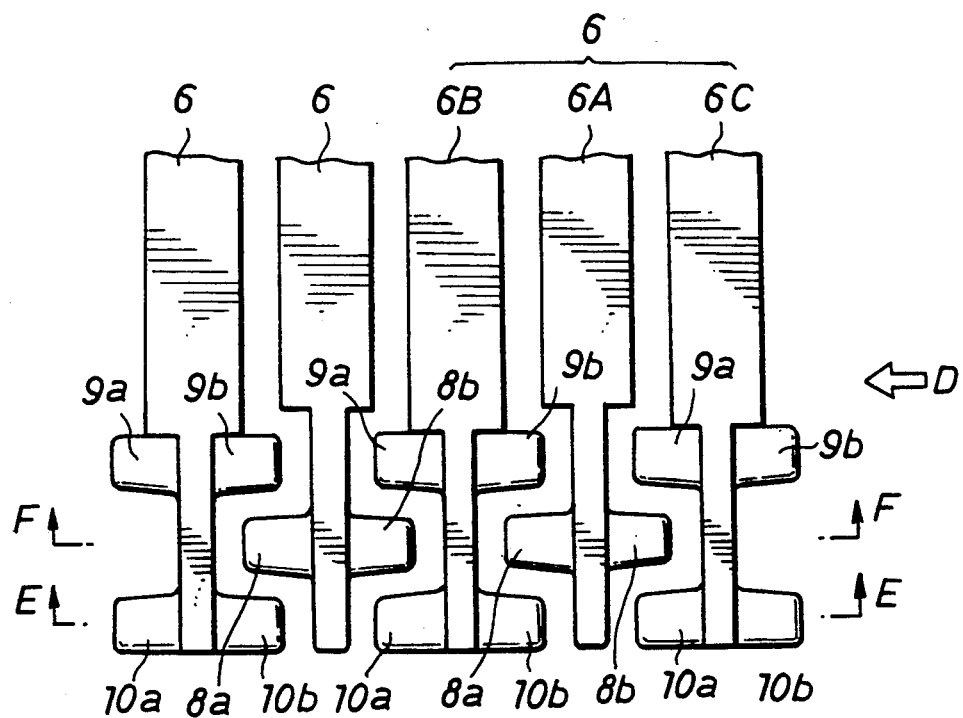
FIG. 4 is an enlarged view of the portion C of FIG. 3.
Figure 5:
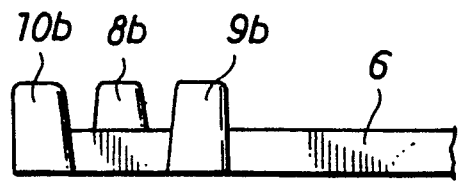
FIG. 5 is a cross sectional view of the portion C as seen in the direction of the arrow D of FIG. 4.

As shown in detail in FIGS. 4 through 7, the lowermost short portion (that is, the free end portion at which a wafer W is contacted) of each resilient press strip 6 is either formed with a pair of down-pointing wafer guide ramps 8a, 8b or two pairs of down-pointing wafer guide ramps 9a, 9b, and 10a, 10b; these two kinds of resilient press strips are arranged alternately. The guide ramps are for guiding the wafer's edge to be properly caught by the respective press strips. As shown in FIG. 4, each guide ramp 8a of a resilient press strip 6A is disposed between a guide ramp 9a and a guide ramp 10b of a neighboring resilient press strip 6B; on the other hand, the other guide ramp 8b of the resilient press strip 6A is disposed between a guide ramp 9a and a guide ramp 10a of the other neighboring resilient press strip 6C. When seen in the direction of arrows E—E or F—F of FIG. 4, each guide ramp 8a overlaps with the guide ramp 9b and 10b which are disposed in the same gap between press strips 6 as is the ramp 8a, and each guide ramp 8b overlaps with the guide ramps 9a and 10a which are disposed in the same gap between press strips 6 as the guide ramp 8b.

Figure 6:
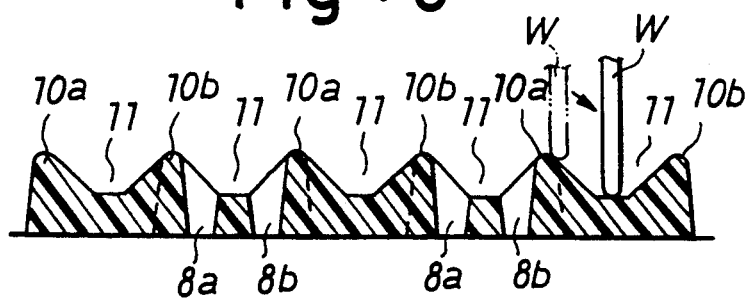
FIG. 6 is a cross section taken on the line E—E of FIG. 4.
Figure 7:
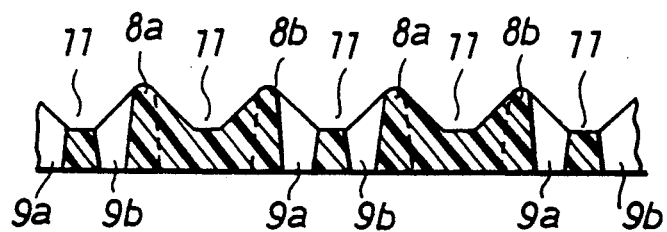
FIG. 7 is a cross section taken on the line F—F of FIG. 4.

As shown in FIGS. 6 and 7, each pair of guide ramps such as 8a-8b, 9a-9b, and 10a-10b, form a groove 11 defined by the ramp faces of the ramps (upper faces when seen in FIGS. 6 and 7), which are sloped, for guiding and receiving the wafer's edges.

Figure 8:
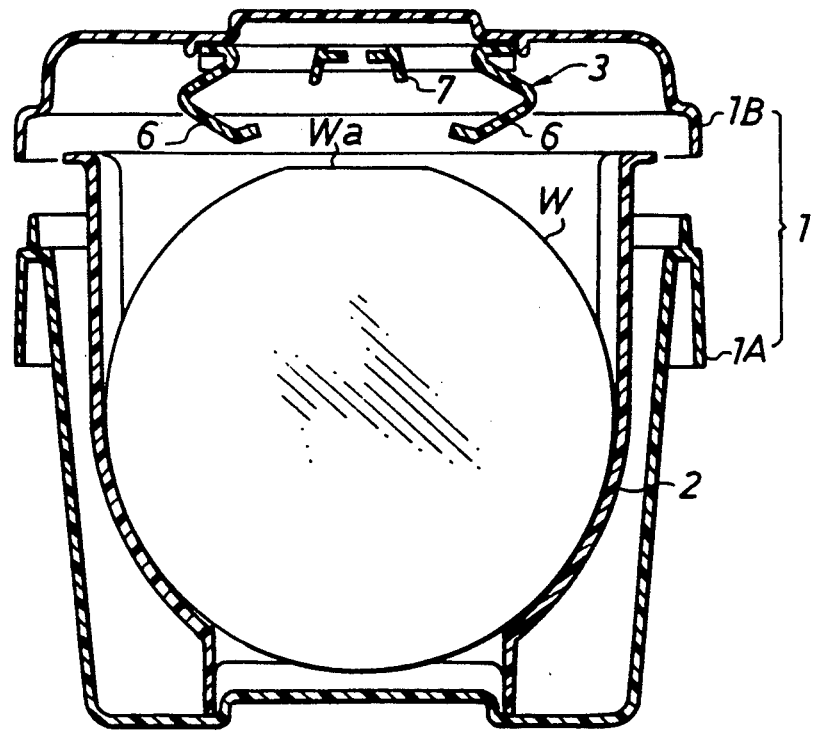
FIG. 8 is a cross-sectional front view of a wafer basket useful in explaining the function of the wafer press means.
Figure 9:
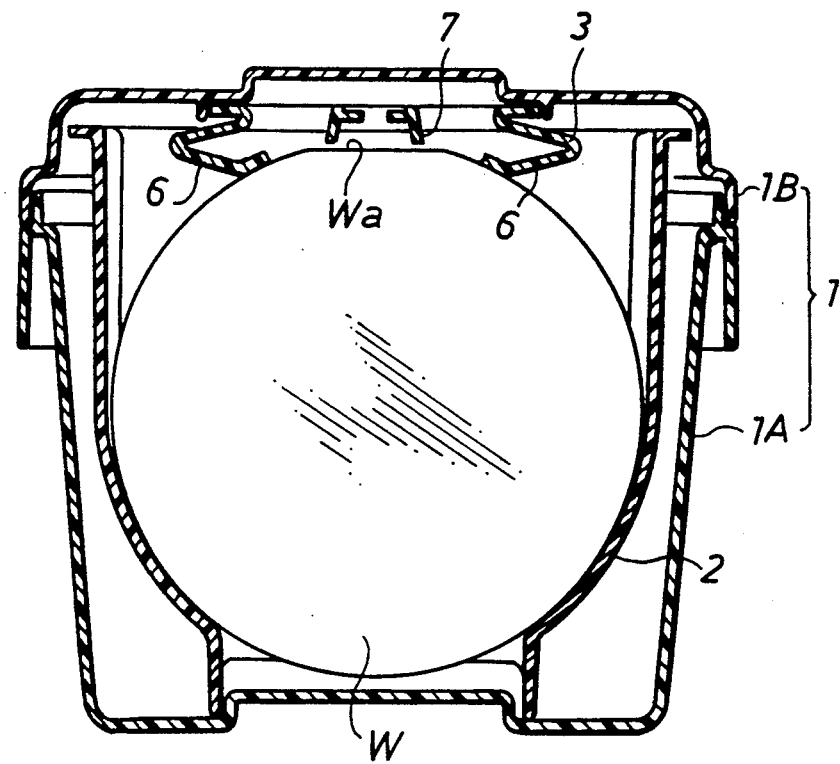
FIG. 9 is a cross-sectional front view of a wafer basket useful in explaining the function of the wafer press means.

As shown in FIG. 8, the inner box 2, which contains a plurality of wafers W arranged in a row in the direction perpendicular to the sheet of FIG. 8, is inserted in the main body 1A of the outer box 1; then, the top lid 1B is fitted on the main body 1A, as shown in FIG. 9, whereupon the wafer press means 3 provided underneath the top lid 1B contacts the upper edges of the wafers W and is depressed by the upper edges of the wafers W so that the wafers are resiliently biased downwardly. More particularly, each pair of mirror-symmetrical resilient press strips 6, 6 of the wafer press means 3 contact the upper edge of each wafer W and resiliently bias the wafer W downwardly so that when the wafer basket receives a physical shock, the wafer W is prevented from jumping out of the groove 2b. The upper edges of the wafers W are each guided and fitted in the grooves 11 formed between the guide ramps 8a, 8b (or between the guide ramps 9a, 9b as well as between the guide ramps 10a, 10b), and thus the wafers W are supported to stand vertically. The guide ramps 8a overlap with the ramps 9b and 10b when seen as in FIG. 6, and similarly the guide ramps 8b overlaps with the ramps 9a and 10a, so that the wafers W are not liable to slip into the gaps between the press strips 6. Therefore, as the top lid 1B is fitted on the outer box 1A, the wafers W are all guided by the ramps and caught in the respective grooves 11; for example, the upper edge of a wafer W drawn in two-dot chain line in FIG. 6 shifts along the sloped inner faces of the ramps 9a and 10a in the direction shown by the arrow until the wafer W automatically arrives in the bottom of the groove 11, as it is drawn in sold line.

Figure 10:
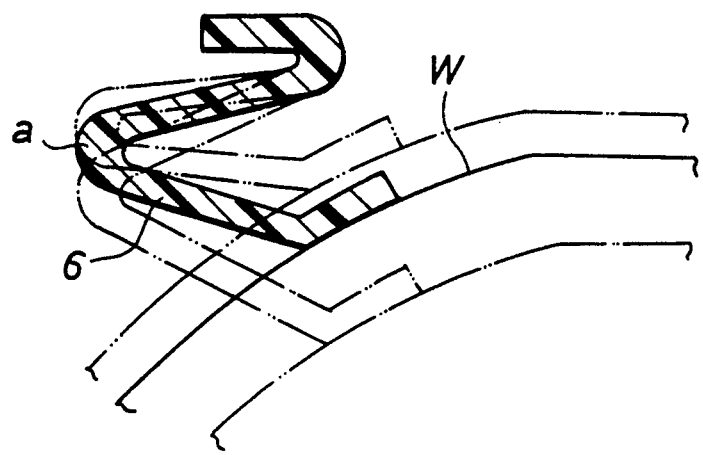
FIG. 10 is a cross section of a wafer press means showing the performance of a press strip.

Thus, all the wafers W stored in the inner box 2 are resiliently pressed by the wafer press means 3 so that when the wafer basket receives a shock during transportation and a wafer W vibrates as shown in FIG. 10, and jumps up and down from the position drawn in sold line to those drawn in two-dot chain line, the motion of the wafer is softened and mitigated as the resilient press strips 6 of the wafer press means 3 undergo a bending and stretching motion between the frame 5 of wafer press means 3 and the wafer W, thus absorbing the vibration mainly at a bending elbow a. As the result, there occurs scarce rubbing between each resilient press strip 6 and the wafer edge; hence, the resilient press strips 6 do not produce particles which would otherwise contaminate the wafers W. Incidentally, the wafer press means 3 effectively performs its conventional performance of resiliently holding the wafers W to thereby prevent the wafers from breaking. As shown in FIG. 9, the orientation flat press means 7 provided in the wafer press means 3 are adapted to engage with the orientation flat edge Wa of each wafer W to thereby prevent the wafer W from turning circumferentially. As the result, there occurs scarce sliding of the wafer edge on the inner box 2; hence, the wafers are safe from being contaminated by the particles that may otherwise be produced by the sliding. Incidentally, as shown in FIG. 8 and FIG. 9, each wafer W is inserted in the inner box 2 with its orientation flat edge Wa facing the sky.

Figure 12:
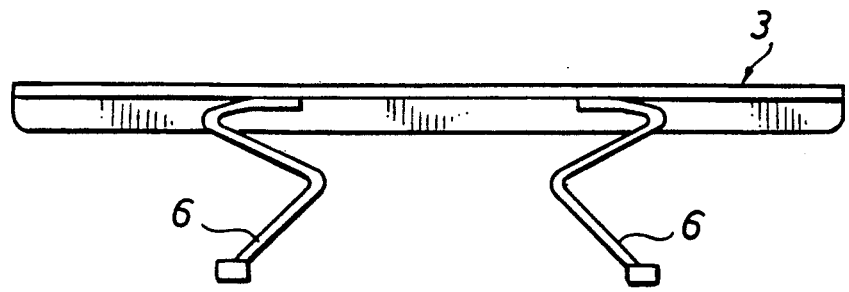
FIG. 12 is a front view of a wafer press means of another embodiment.

In the foregoing embodiment, the resilient press strips 6 are bent such that they look like a pair of inequality signs opening inwardly, but it is possible to adopt resilient press strips which are bent such that they open outwardly, as shown in FIG. 12.

Figure 15:
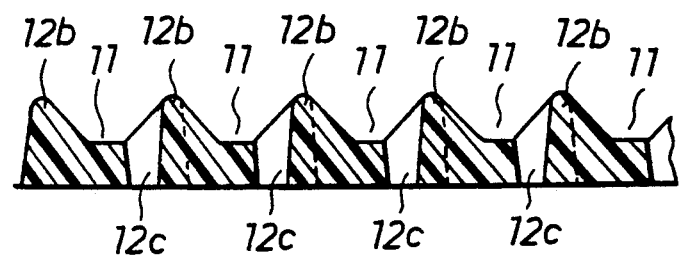
FIG. 15 is a cross section of the press strips taken on the line H—H of FIG. 13.
Figure 16:
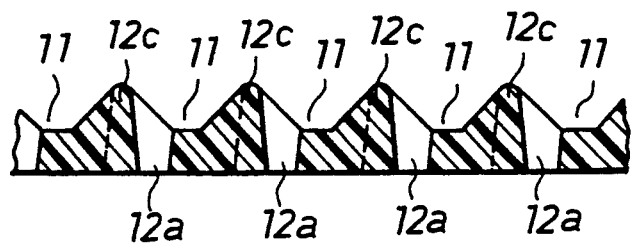
FIG. 16 is a cross section of the press strips taken on the line J—J of FIG. 13.
Figure 17:
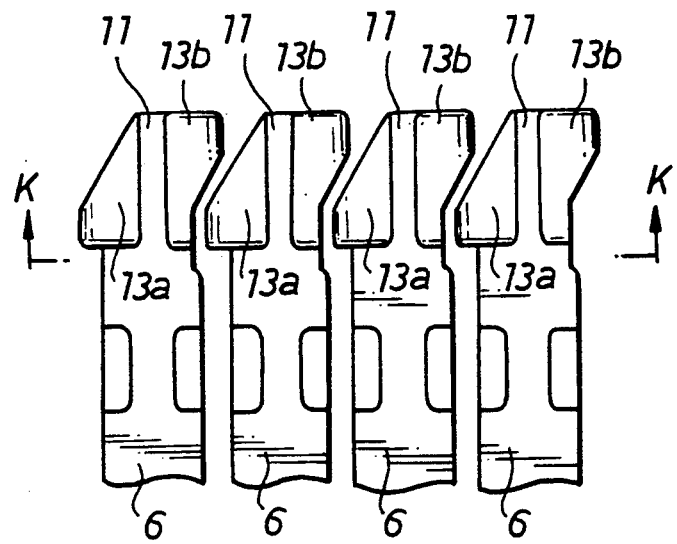
FIG. 17 is a bottom view of resilient press strips having wafer guide ramps.
Figure 18:
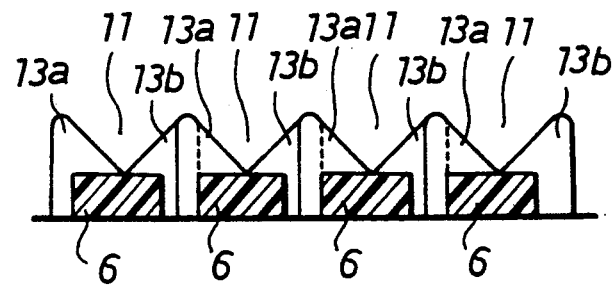
FIG. 18 is a cross section of the press strips taken on the line K—K of FIG. 17.
Figure 19:
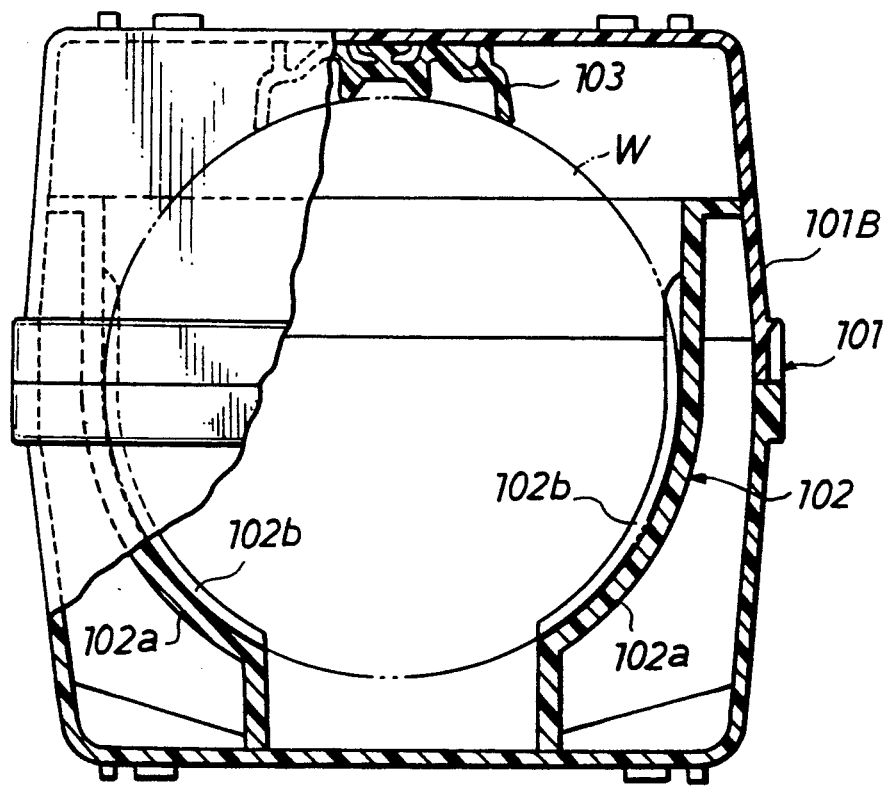
FIG. 19 is a front view of a conventional wafer basket, partially broken.

Alternative to the one shown in FIGS. 4 through 7, possible designs of the wafer press means 3 for preventing the wafers W from slipping into the gaps between the resilient press strips 6 include one shown in FIGS. 13 through 16, and another shown in FIG. 17 and FIG. 18.

Figure 13:
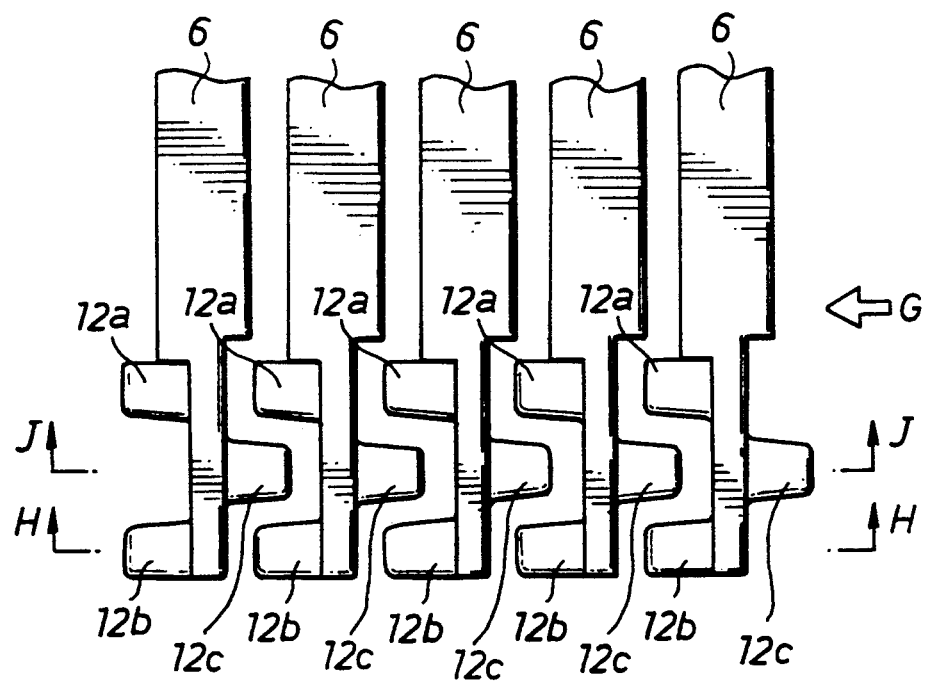
FIG. 13 is a bottom view of resilient press strips having wafer guide ramps.
Figure 14:
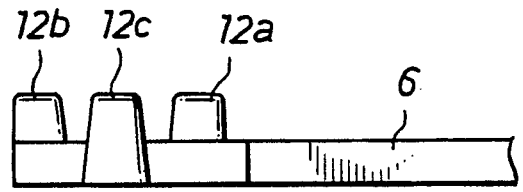
FIG. 14 is a view of the press strips as seen in the direction of the arrow G in FIG. 13.

FIG. 13 is a bottom view of resilient press strips 6 having wafer guide ramps, FIG. 14 is a view of the press strips 6 as seen in the direction of the arrow G in FIG. 13, FIG. 15 is a cross section of the press strips 6 taken on the line H—H of FIG. 13, FIG. 16 is a cross section of the press strips 6 taken on the line J—J of FIG. 13.

According to the alternative design shown in FIGS. 13 through 16, the free end portion of each resilient press strip 6 is of one kind and formed with three down-pointing guide ramps 12a, 12b and 12, of which 12a and 12b are on the same side and 12c on the other, as shown in FIG. 13. One guide ramp 12c of a resilient press strip 6 is disposed between a guide ramp 12a and a guide ramp 12b in each gap between neighboring resilient press strips 6. When seen in the direction of arrows H—H or J—J in FIG. 13, a guide ramp 12c overlaps with the guide ramps 12a and 12b disposed in the same gap between resilient press strips 6. As shown in FIGS. 15 and 16, each combination of overlapping ramps 12a, 12b and 12c form a groove 11 defined by the ramp faces of the ramps.

FIG. 17 is a bottom view of resilient press strips 6 having wafer guide ramps, and FIG. 18 is a cross section of the press strips 6 taken on the line K—K of FIG. 17. In the alternative design of FIG. 17 and FIG. 18, the free end portion of each resilient press strip 6 is of one kind and formed with a pair of down-pointing guide ramps 13a and 13b, which are respectively on the opposite sides of each press strip 6, as shown in FIG. 17. When seen as in FIG. 18, each wafer guide ramp 13a overlaps with the guide ramp 13b disposed in the same gap between neighboring resilient press strips 6. As shown in FIG. 18, each combination of overlapping ramps 13a and 13b form a groove 11 defined by the ramp faces of said ramps in which the upper edges of the wafers W are each guided and fitted in the grooves 11.

Next, a further embodiment of a wafer basket of the invention having still another novel press means will be described. The general construction of the wafer basket comprising an outer box 201 and an inner box 202 is the same as those of the foregoing embodiments.

Figure 20:
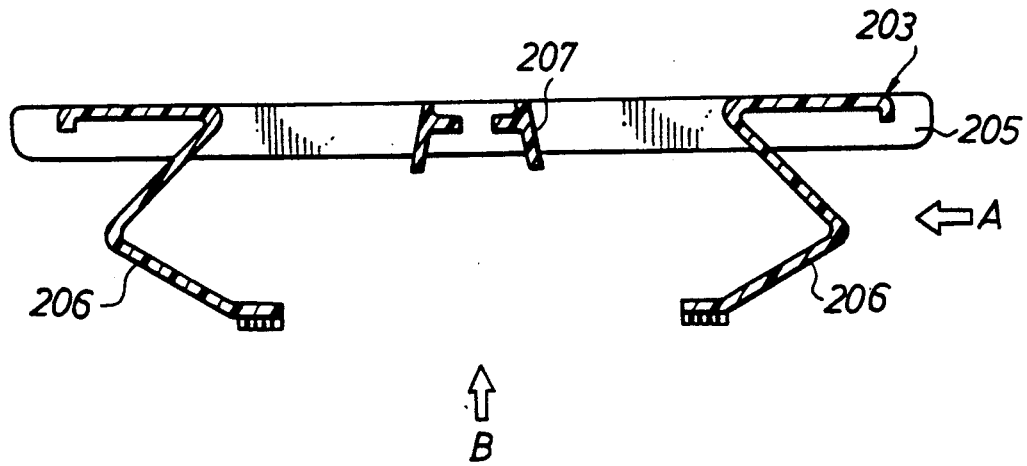
FIG. 20 is a vertical cross section of the wafer press means.
Figure 21:
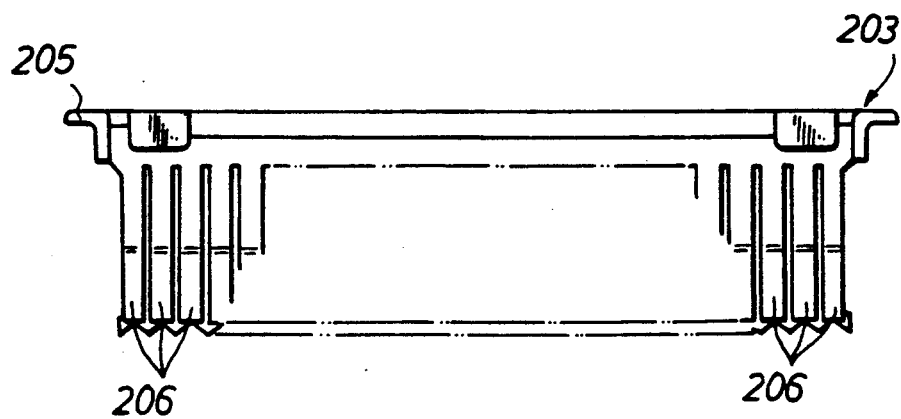
FIG. 21 is a side view of the same wafer press means as seen in the direction of the arrow A of FIG. 20.
Figure 22:
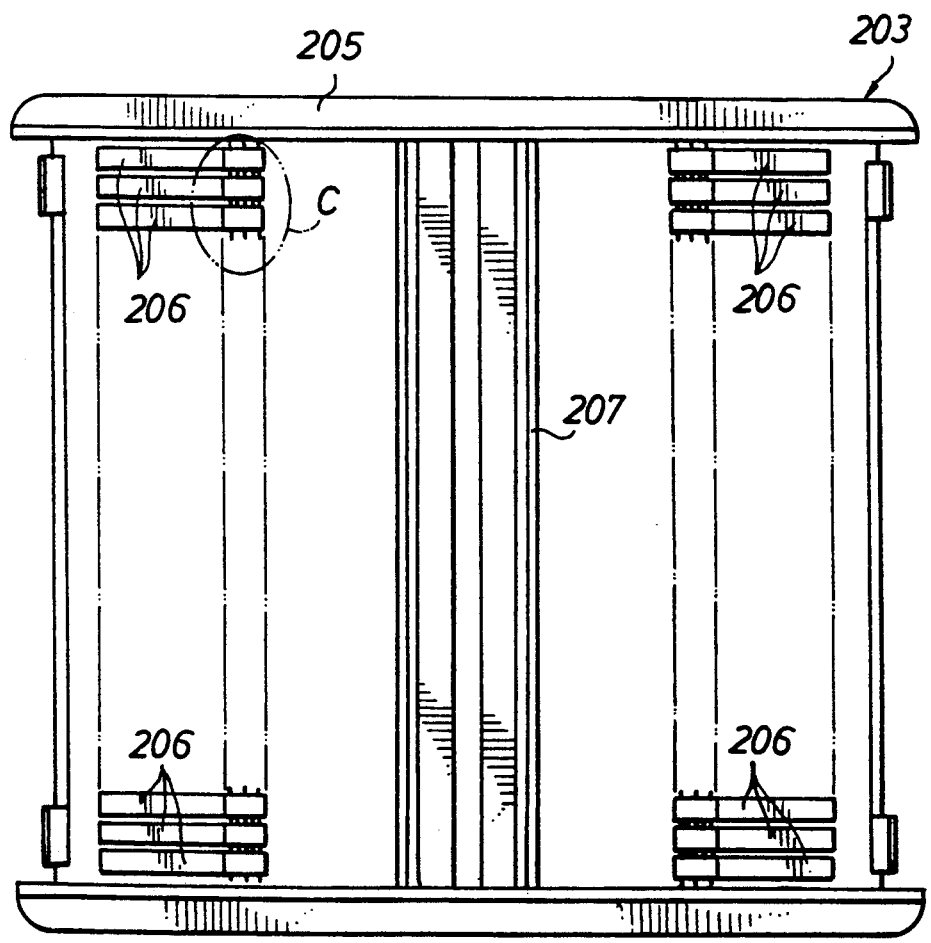
FIG. 22 is a bottom view of the same wafer press means as seen in the direction of the arrow B of FIG. 20.

The construction of a wafer press means 203, according to the invention, will be described in detail with reference to FIGS. 20 through 25. Incidentally, FIG. 20 is a vertical cross section of the wafer press means 203, FIG. 21 is a side view of the same means 203 as seen in the direction of the arrow A of FIG. 20, FIG. 22 is a bottom view of the same means 203 as seen in the direction of the arrow B of FIG. 20, FIG. 23 is an enlarged view of the portion C of FIG. 22, FIG. 24 is a view of the portion C as seen in the direction of the arrows D of FIG. 23, and FIG. 25 is a cross section taken on the line E—E of FIG. 23.

Figure 26:
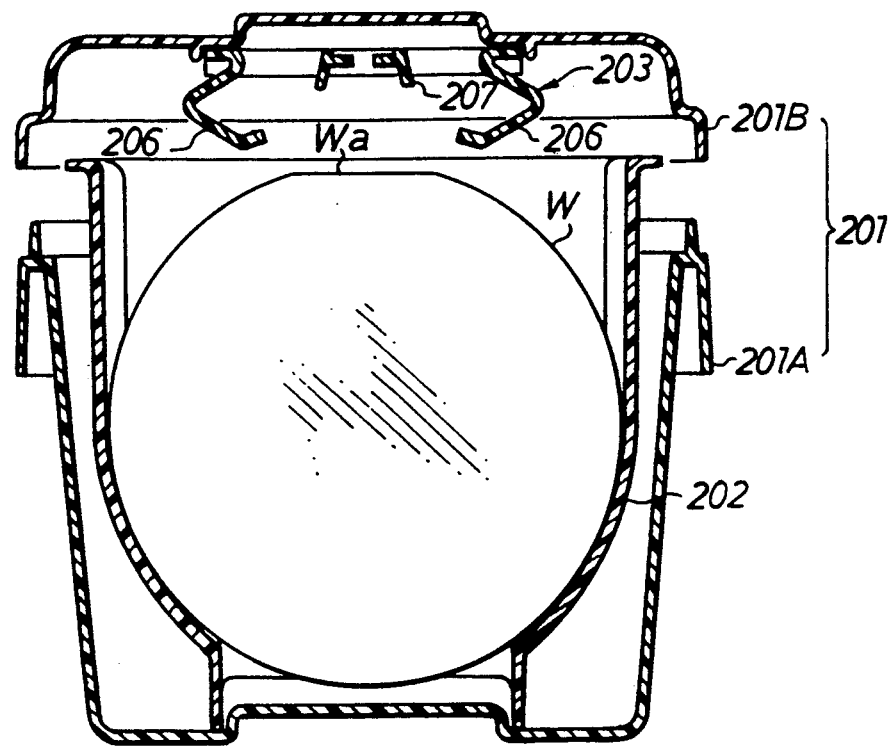
FIG. 26 is a cross-sectional front view of a wafer basket useful in explaining the function of the wafer press means.

The wafer press means 203 of this embodiment is also made of a thermoplastic elastomer (polyester) having a high friction coefficient, produced by monobloc casting. The wafer press means 203 includes a rectangular frame 205, from which extend downwardly two rows of resilient press strips 206, which 206 are bent generally in the following manner (ref. FIG. 20): the uppermost portion is horizontal and on a same level with the frame 205, a second portion begins from the inner end of said uppermost portion and extends downward in a direction that forms an angle of about 50° with said uppermost portion, a third portion begins from the lower end of said second portion and extends downward in a direction that forms an angle of about 80° with said second portion, and the lowermost short portion extends horizontally and inwardly from the lower end of said third portion. Thus, when seen as they are in FIG. 20, they look like a pair of inequality signs opening inwardly and toward each other. The two rows of the resilient press strips 206 are arranged in a row parallel to each other (perpendicular to the sheet of FIG. 20) and at the same close intervals as the ribs 202b (FIG. 26). In parallel with, and in the midway between, the two rows of the resilient press strips 206 of the frame 205 is provided a row of orientation flat press strips 207 at the same intervals as the resilient press strips 206.

Figure 23:
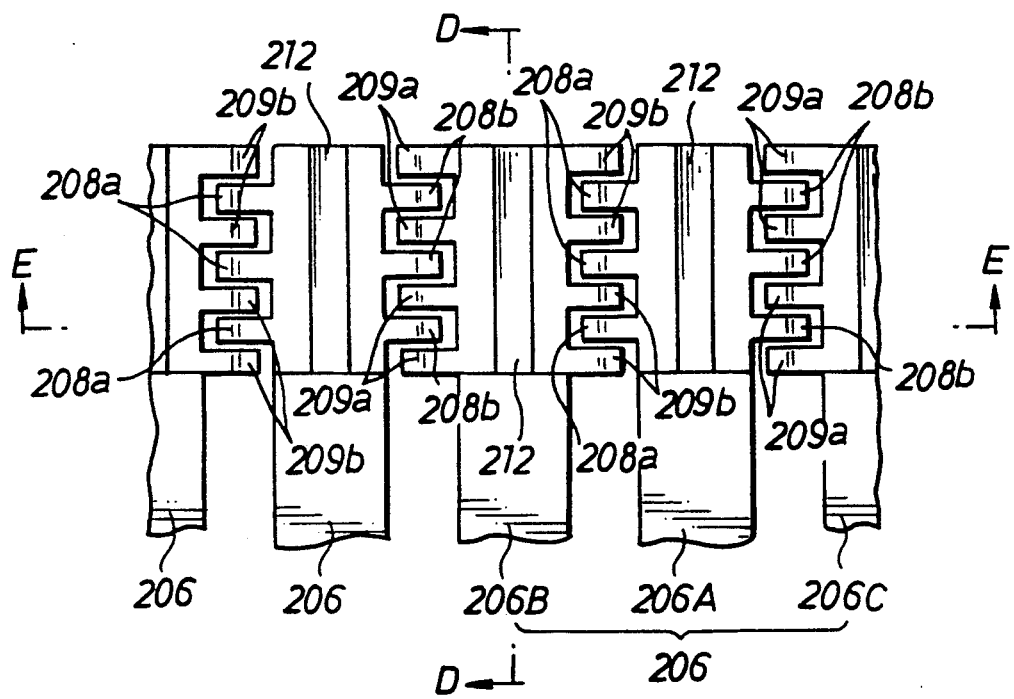
FIG. 23 is an enlarged view of the portion C of FIG. 22.
Figure 24:
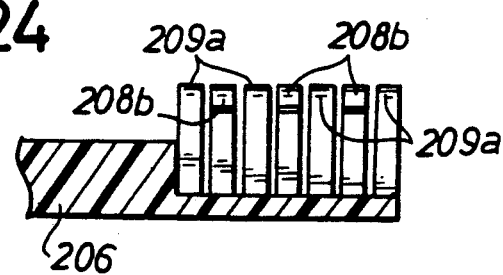
FIG. 24 is a view of the portion C as seen in the direction of the arrows D of FIG. 23.
Figure 25:
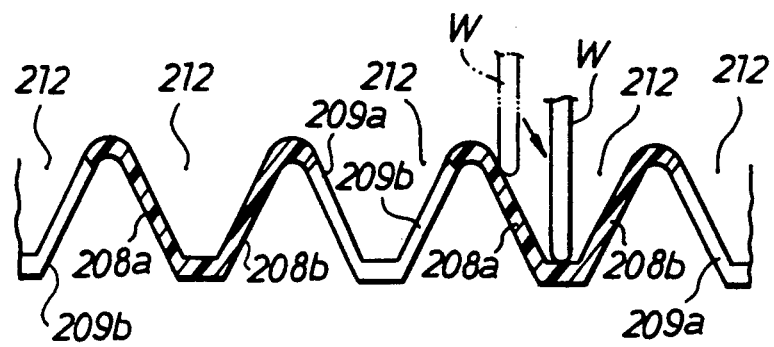
FIG. 25 is a view of the portion C as seen in the direction of the arrows E of FIG. 23.

As shown in detail in FIGS. 23 through 25, the lowermost short portion (that is, the free end portion at which a wafer W is contacted) of each resilient press strip 206 is either formed with a plurality of down-pointing wafer guide ramps 208a, 208b or down-pointing wafer guide ramps 209a, 209b. As shown in particular in FIG. 23, each press strip 206A is provided with three guide ramps 208a on one side and three guide ramps 208b on the other, and each press strip 206B neighboring on one side of each strip 206A is provided with four guide ramps 209a on one side and four guide ramps 209b on the other, and each press strip 206C neighboring on the other side of each strip 206A is similarly provided with four guide ramps 209a and four guide ramps 209b. The guide ramps are for guiding the wafer's edge to be properly caught by the respective press strips. As shown in FIG. 23, each guide ramp 208a of a resilient press strip 206A is disposed between guide ramps 209b of a neighboring resilient press strip 206B; on the other hand, each guide ramp 208b of the resilient press strip 206A is disposed between guide ramps 209a of the other neighboring resilient press strip 206C. When seen in the direction of arrows E—E of FIG. 23, that is, in FIG. 25, each guide ramp 208a overlaps with the guide ramps 209b which are disposed in the same gap between press strips 206 as is the ramp 208a, and each guide ramp 208b overlaps with the guide ramps 209a which are disposed in the same gap between press strips 206 as is the guide ramp 208b.

As shown in FIG. 25, each pair of guide ramps such as 208a-208b and 209a-209b form a groove 212 defined by the ramp faces of the ramps (upper faces when seen in FIG. 25), which are sloped, for guiding and receiving the wafer's edges.

Figure 27:
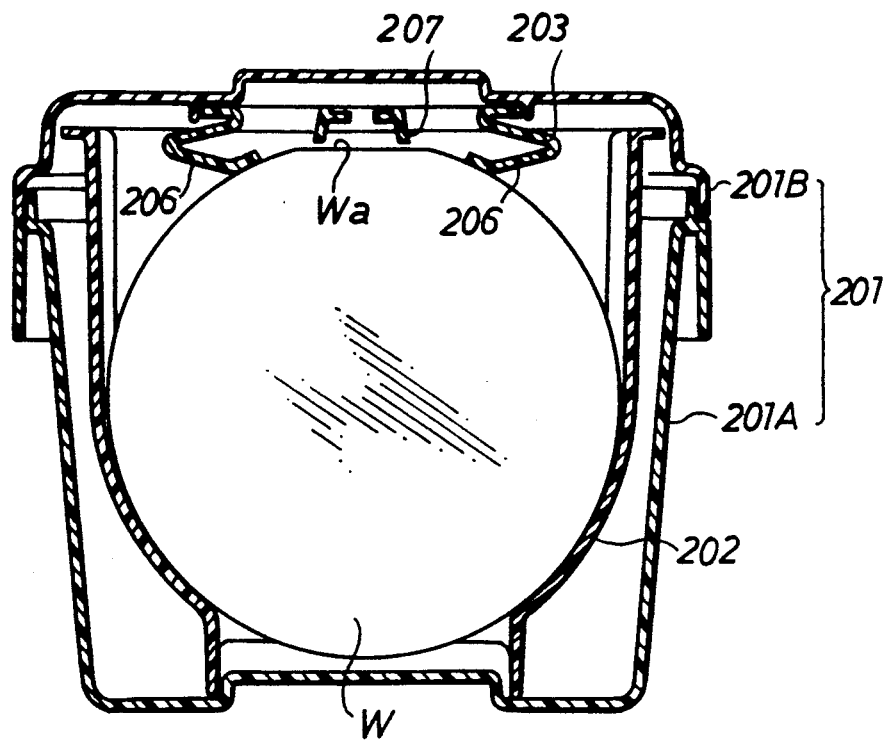
FIG. 27 is a cross-sectional front view of a wafer basket useful in explaining the function of the wafer press means.

As shown in FIG. 26, the inner box 202, which contains a plurality of wafers W arranged in a row in the direction perpendicular to the sheet of FIG. 26, is inserted in the main body 201A of the outer box 201; then, the top lid 201B is fitted on the main body 201A, as shown in FIG. 27, whereupon the wafer press means 203 provided underneath the top lid 201B contacts the upper edges of the wafers W and is depressed by the upper edges of the wafers W so that the wafers are resiliently biased downwardly, and when the wafer basket receives a physical shock, the wafers W are prevented from jumping out of the grooves 202b. The upper edges of the wafers W are each guided and fitted in the grooves 212 formed between the guide ramps 208a, 208b (or between the guide ramps 209a, 209b), and thus the wafers W are supported to stand vertically. The guide ramps 208a overlap with the ramps 209b when seen as in FIG. 25, and similarly the guide ramps 208b overlaps with the ramps 209a, so that the wafers W are not liable to slip into the gaps between the press strips 206. Therefore, as the top lid 201B is fitted on the outer box 201A, the wafers W are all guided by the ramps and caught in the respective grooves 212; for example, the upper edge of a wafer W drawn in two-dot chain line in FIG. 25 shifts along the sloped inner faces of the ramps 208a in the direction shown by the arrow until the wafer W automatically arrives in the bottom of the groove 212, as it is drawn in sold line.

Thus, all the wafers W stored in the inner box 202 are resiliently pressed by the wafer press means 203 so that when the wafer basket receives a shock during transportation and a wafer W vibrates and jumps up and down, the motion of the wafer W is softened and mitigated as the resilient press strips 206 of the wafer press means 203 undergo a bending and stretching motion between the frame 205 of wafer press means 203 and the wafer W, thus absorbing the vibration. As the result, there occurs scarce rubbing between each resilient press strip 206 and the wafer edge; hence, the resilient press strips 206 do not produce particles which would otherwise contaminate the wafers W.

The guide ramps 208a, 208b, 209a or 209b are formed at the lowermost short portion of each press strip 206 and they are gathered at the free end of the press strip 206 so that the upper edges of the wafer W stored in the waver basket are pressed by the press strips 206 virtually all at once; for this reason too, the wafers W are prevented from entering the gaps between the press strips 206.

As shown in FIG. 27, each pair of orientation flat press strips 207 provided in the wafer press means 203 are adapted to engage with the orientation flat edge Wa of each wafer W to thereby prevent the wafer W from turning circumferentially. As the result, there occurs scarce sliding of the wafer edge on the inner box 202; hence, the wafers are safe from being contaminated by the particles that may otherwise be produced by the sliding. Incidentally, as shown in FIG. 26 and FIG. 27, each wafer W is inserted in the inner box 202 with its orientation flat edge Wa facing the sky.

Figure 28:
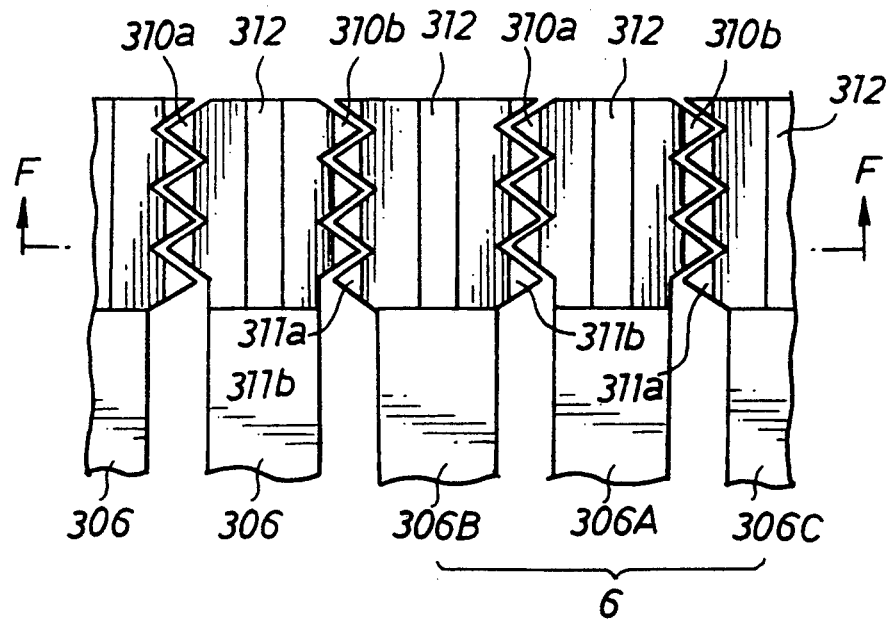
FIG. 28 is a bottom view of a portion of the wafer press means seen from below.
Figure 29:
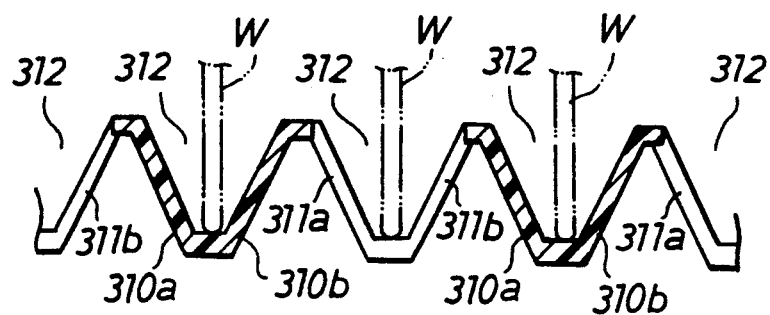
FIG. 29 is a cross section taken on the line F—F of FIG. 28.

Next, a last embodiment of the present invention will be described with reference to FIG. 28 and FIG. 29. FIG. 28 is a bottom view of a portion of the wafer press means of this embodiment seen from below; FIG. 29 is a cross section taken on the line F—F of FIG. 28.

In this embodiment, the lower face of the free end portion of each press strip 306 is formed with either wafer guide ramps 310a, 310b or wafer guide ramps 311a, 311b which all are shaped like saw teeth when seen in FIG. 28. Each guide ramp 310a of a resilient press strip 306A is disposed between guide ramps 311b of a neighboring resilient press strip 306B; on the other hand, each guide ramp 310b of the resilient press strip 306A is disposed between guide ramps 311a of the other neighboring resilient press strip 306C. When seen in the direction of arrows F—F of FIG. 28, that is, in FIG. 29, each guide ramp 310a overlaps with the guide ramps 311b which are disposed in the same gap between press strips 306 as is the ramp 310a, and each guide ramp 310b overlaps with the guide ramps 311a which are disposed in the same gap between press strips 306 as in the guide ramp 310b.

As shown in FIG. 29, each pair of guide ramps such as 310a-310b and 311a-311b form a groove 312 defined by the ramp faces of the ramps, which are sloped, for conveniently guiding and receiving the wafer's edges.

Thus in this embodiment also, the neighboring guide ramps overlap with each other to block the gaps between the press strips 306, so that the wafers W are not liable to slip into the gaps between the press strips 306. Therefore, the wafers W are all guided by the ramps and caught in the respective grooves 312. Hence, the wafers are safe from being inadvertently caught between the press strips 30 and producing contaminant particles.

Obviously many modifications and variations of the present invention are possible in the light of the above teachings. It is therefore to be understood that within the scope of the appended claims the invention may be practiced otherwise than is specifically described.

What is claimed is:

1. A wafer basket comprising a main body and a top lid provided with a detachable wafer press means on the back face of the top lid, characterized by that said wafer press means includes a rectangular frame, and two rows of resilient press strips which are made of a thermoplastic elastomer having a high friction coefficient and extend downwardly from said rectangular frame for pressing down wafers to be contained in the wafer basket, said resilient press strips being bent and capable of temporarily changing the bent angles in response to external shocks such that the free end of each press strip at which each strip presses on the wafer stays immobile with respect to the edge of the wafer.

2. The wafer basket as claimed in claim 1 wherein said resilient press strips are bent at least two locations.

3. The wafer basket as claimed in claim 2 wherein said resilient press strips are made of a polyester resin.

4. The wafer basket as claimed in claim 3 wherein said resilient press strips are each provided with guide ramps on either side of the free end portion in a manner such that the guide ramps of the same press strips form grooves into which the wafer edges are guided by said guide ramps and such that, when seen in the direction of the length of the free end portion of the press strips, the guide ramps overlap with the guide ramps of the neighboring press strips without touching the guide ramps of the neighboring press strips so that the guide ramps prevent the wafer edges from entering the gaps between the press strips.

5. The wafer basket as claimed in claim 4 wherein said guide ramps are seen like saw teeth meshed with neighboring teeth when seen from below.

6. The wafer basket as claimed in claim 4 wherein said guide ramps are seen like comb teeth meshed with neighboring teeth when seen from below.

7. The wafer basket as claimed in claim 4 wherein said resilient press strips are each provided with closed arranged guide ramps.

8. The wafer basket as claimed in claim 4 wherein said wafer press means further comprises an orientation flat press means which is elongated in the direction the wafers are arranged, and is adapted to engage with the orientation flat of each wafer.

* * * * *